United States Patent [19]
Martinez

[11] Patent Number: 6,064,108
[45] Date of Patent: May 16, 2000

[54] INTEGRATED INTERDIGITATED CAPACITOR

[75] Inventor: Gerald M. Martinez, Long Beach, Calif.

[73] Assignee: Hughes Electronics Corporation, El Segundo, Calif.

[21] Appl. No.: 08/922,983

[22] Filed: Sep. 2, 1997

[51] Int. Cl.[7] .................................................. H01L 29/41
[52] U.S. Cl. ............................................. 257/532; 257/535
[58] Field of Search ..................................... 257/532, 535

[56] References Cited

U.S. PATENT DOCUMENTS

| | | | |
|---|---|---|---|
| 4,700,457 | 10/1987 | Matsukawa | 437/52 |
| 5,773,872 | 6/1998 | Kobatake | 257/532 |
| 5,861,648 | 1/1999 | Shinozaki | 257/300 |

FOREIGN PATENT DOCUMENTS

| | | | |
|---|---|---|---|
| 63-029962 | 2/1988 | Japan | 257/535 |
| 2-240958 | 9/1990 | Japan | 257/532 |
| 2-305460 | 12/1990 | Japan | 257/532 |
| 4-196583 | 7/1992 | Japan | 257/532 |

OTHER PUBLICATIONS

J.P. Uyemura, *Physical Design of CMOS Integrated Circuits Using L–Edit*™, PWS Publishing Co., 1995, pp. 10–8 to 10–20.

G.W.A. Dummer, *Radio and Electronic Components: Volumne 3–Fixed Capacitors*, Sir Isaac Pitman & Sons Ltd., 1964, pp. 12–13.

P.E. Allen and D.R. Holberg, *CMOS Analog Circuit Design*, Holt, Rinehart and Winston, 1987, pp. 22–87.

*Primary Examiner*—David Hardy
*Attorney, Agent, or Firm*—Terje Gudmestad; M. W. Sales

[57] ABSTRACT

An integrated, interdigitated capacitor incorporates all layers of an I.C. fabrication process into its design to produce a multi-layer high-capacitance device. For example, a "two-metal, two-poly" CMOS fabrication process is used to produce a capacitor having five interdigitated conductive plates, which when interconnected produce a total capacitance at least twice as great as a conventional two-plate capacitor of the same area, while requiring no additional I.C. processing steps. The invention's conductive plates and interconnections are arranged so that interconnection traces stay within strict design limits intended to insure reliable connections, while keeping the area required for the interconnections small.

10 Claims, 6 Drawing Sheets

| INTERDIGITATED ACTIVE AREA ($\mu m^2$) | ACTUAL SURFACE AREA ($l \times w$) ($\mu m^2$) | CAPACITANCE | | | |
|---|---|---|---|---|---|
| | | PREFERRED EMBOD. (EQ.2) | 4-LAYER (EQ.3) | THIN OXIDE (EQ.4) | CONVENTIONAL POLY-POLY |
| 26x26 | 42x26 | 923.2 fF | 646.1 fF | 1282 fF | 417.7 fF |
| 52x52 | 68x52 | 3879 fF | 2650 fF | 5276 fF | 1540 fF |
| 78x78 | 94x78 | 8872 fF | 6010 fF | 11.98 pF | 3341 fF |
| 104x104 | 120x104 | 15.90 pF | 10.73 pF | 21.41 pF | 5821 fF |
| 520x520 | 536x520 | 405.3 pF | 270.8 pF | 541.40 pF | 137.8 pF |
| 1300x1300 | 1316x1300 | 2540 pF | 1695 pF | 3390.00 pF | 853.6 pF |

FIG.3

INTEGRATED INTERDIGITATED CAPACITOR

BACKGROUND OF THE INVENTION

1. Field of the Invention

This invention relates to integrated circuit (I.C.) capacitors, and more particularly to interdigitated capacitors fabricated on an I.C. die.

2. Description of the Related Art

Capacitors, used in a vast number of electronic circuits, exist in both discrete and integrated forms. Discrete capacitors can provide a relatively large, precise value of capacitance. Many circuits, however, are preferably implemented as I.C.s, where a discrete capaci-or is of no use. A discrete capacitor may be used as part of a hybrid circuit, but this can be costly, requires a larger package and an intricate installation step, and necessitates the use of electrical interconnections such as wire bonds, which tend to degrade a circuit's performance, particularly at higher frequencies.

Integrated capacitors, on the other hand, may be fabricated on an I.C. die simultaneously with other circuit components, and interconnections to them are made with the same I.C. metallization layer(s) used to interconnect the other components. Thus, standard integrated capacitors are obtained at virtually no cost in terms of I.C. processing steps. They do suffer from a major shortcoming, however, in that the value of capacitance which can be practically obtained is very small, due to their small size. The capacitance C of a capacitor formed from two parallel conductive plates is given by:

$$C = \in A/d, \quad \text{Eq. 1}$$

where A is the "active area", i.e., the area described by the overlap of the two plates, d is the separation between the plates, and $\in$ is the permittivity of the dielectric material between the plates. As an I.C.'s die size increases, its cost tends to rise and its yield tends to fall. As a result, die sizes are typically kept as small as practically possible, and the amount of die area allocated for capacitors is very limited.

In view of the unrelenting push to further reduce the size of electrical circuits, a need exists for an integrated capacitor which can provide a higher capacitance per unit area than is currently available.

SUMMARY OF THE INVENTION

An integrated, interdigitated capacitor is presented which provides at least twice as much capacitance per unit area as do existing integrated capacitors, while generally requiring no additional I.C. processing steps.

The novel integrated capacitor attains its superior performance by incorporating all layers of an I.C. fabrication process into its design. For example, a "two-metal, two-poly" CMOS process produces an I.C. consisting of (from bottom to top): a substrate (silicon), first and second polysilicon ("poly") layers, and first and second metal layers, with an oxide layer interposed between each of these layers and between the first poly layer and the substrate. The layers are arranged in this way to fabricate CMOS transistors, but as described herein are simultaneously used to produce high-capacitance integrated, interdigitated capacitors.

Approximately square regions of metal and poly are defined in respective layers, and these three-dimensional regions, referred to herein as "plates", are arranged to overlap. The metal and poly plates, along with the I.C.'s substrate, serve as parallel conductive plates, which are interconnected to form a single capacitor having a total capacitance at least twice as great as a conventional two-plate capacitor of the same area.

In a preferred embodiment, the first poly plate and first metal plate are interconnected to form one terminal of the capacitor, and the substrate, second poly plate and second metal plate are interconnected to form the other terminal. The interconnection of plates is accomplished with metal interconnection traces which must traverse a number of conductive and dielectric layers. If the path followed by an interconnection trace is too steep, the possibility of an open or shorted connection increases and the device becomes inherently unreliable. The invention avoids this possibility by having its interconnection traces laid out so as to insure reliable connections, while also keeping the area required for the interconnections as small as possible.

A number of variants on the preferred embodiment are also presented which produce more capacitance per unit area or improved performance, but require alternative materials or additional processing steps.

Further features and advantages of the invention will be apparent to those skilled in the art from the following detailed description, taken together with the accompanying drawings.

BRIEF DESCRIPTION OF THE DRAWINGS

FIG. 3 is a table listing calculated capacitance values for capacitors of various sizes built according to the present invention.

DETAILED DESCRIPTION OF THE INVENTION

Figure 1A:
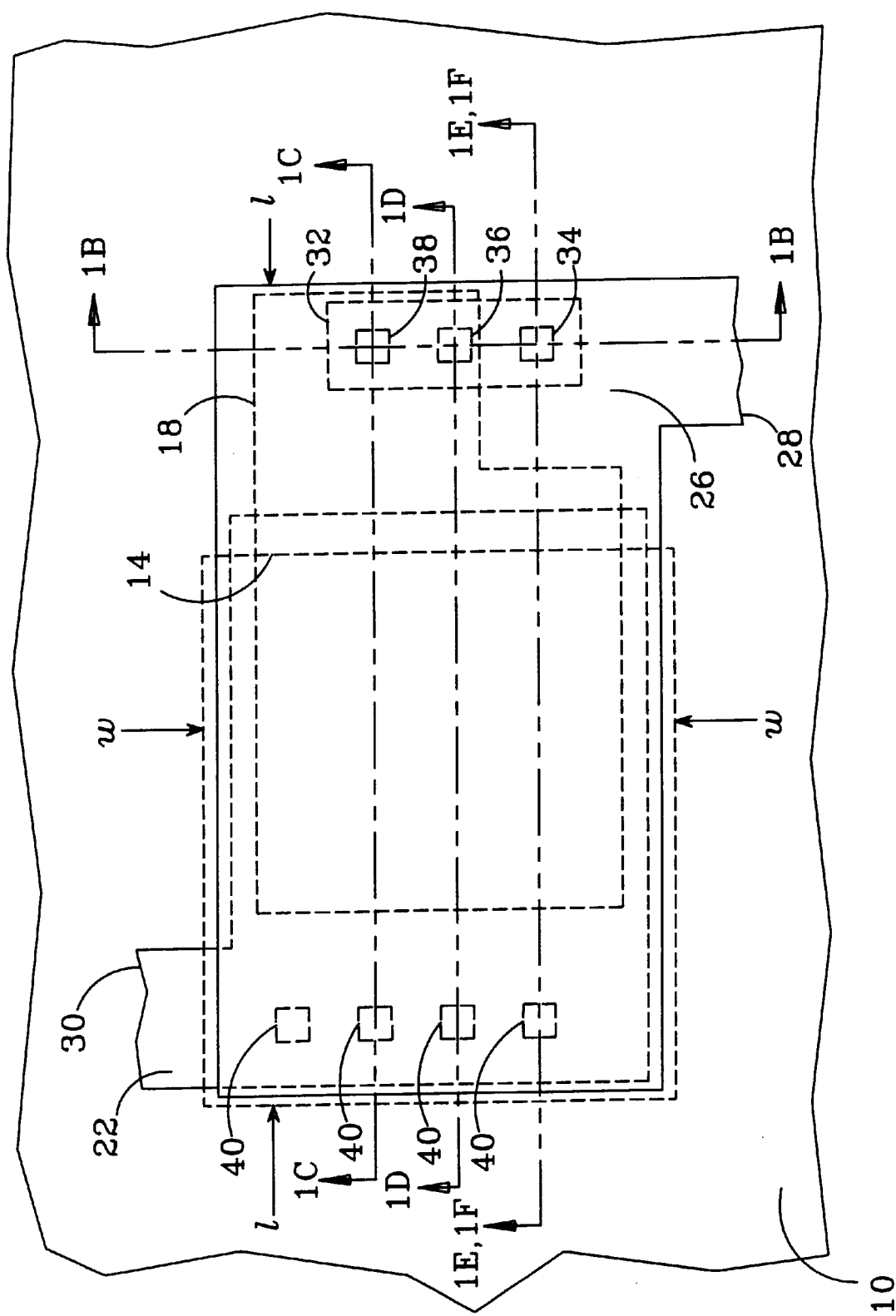
FIG. 1A is a top plan view of an integrated, interdigitated capacitor structure per the present invention.
Figure 1B:
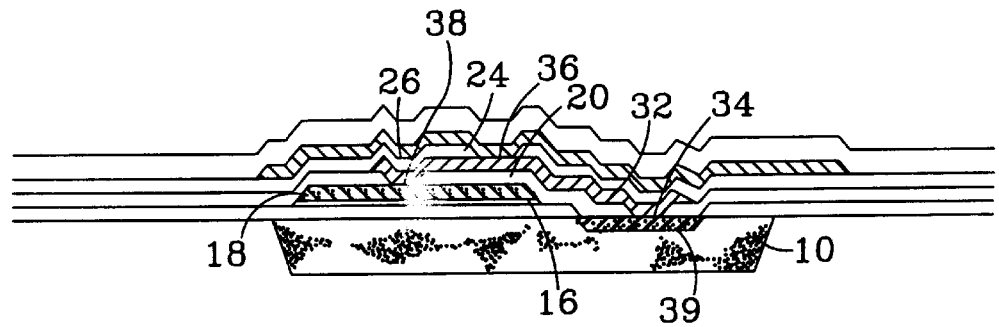
FIGS. 1B, 1C, 1D and 1E are cross-sectional views of the capacitor structure of FIG. 1A, taken along section lines 1B—1B, 1C—1C, 1D—1D, and 1E—1E, respectively.

A top plan view of an integrated, interdigitated capacitor structure is shown in FIG. 1A, with corresponding cross-sectional views shown in FIGS. 1B, 1C, 1D and 1E. The capacitor structure is made up of a number of conductive plates and dielectric layers stacked on top of each other, comprising (from bottom to top): a substrate 10; a dielectric layer 12, preferably silicon dioxide ("oxide"); a first conductive plate 14; a dielectric layer 16; a second conductive plate 18; a dielectric layer 20; a third conductive plate 22; a dielectric layer 24; and a fourth conductive plate 26. Each of the approximately square-shaped conductive plates is defined within a respective conductive layer using conventional masking and photolithographic techniques, and at least partially overlaps the conductive plate immediately below it (with the first conductive plate 14 overlapping the substrate), with each conductive plate approximately parallel to the substrate. These "interdigitated" conductive plates make up a series of parallel conductive plates, with each adjacent pair of conductive plates (and respective interposed oxide layer) acting as a capacitor. That is, capacitors are formed by conductive plates 14 and 18, plates 18 and 22, and plates 22 and 26, with the capacitance of each adjacent pair of conductive plates given by Eq. 1 above. The substrate and conductive plate 14 also form a capacitor. A single two-terminal capacitor is created by interconnecting the substrate, second conductive plate 18 and fourth conductive plate 26 to form a first terminal 28, and interconnecting the first conductive plate 14 and third conductive plate 22 to form a second terminal 30. Because five conductive plates are utilized instead of the conventional I.C. capacitor's two plates, the interdigitated capacitor provides a capacitance that is at least twice as large as a conventional capacitor having the same area.

Metallization traces are used to make the interconnections between plates necessary to form the high capacitance capacitor; the traces travel through intervening oxide layers using "vias", which are fabricated in each layer as necessary. However, unless the interconnection traces and vias are carefully arranged, an unreliable or failure-prone device can result. For example, if vias are simply superimposed on each other to provide an interconnection route between the substrate, second conductive plate and fourth conductive plate, the resulting slope of the metal trace is so steep that it may crack and lead to a premature failure in the form of an open circuit. Alternately, if an oxide layer in the area of a via is too thin it may crack and allow leakage between two conductive plates, leading to premature failure in the form of a short circuit.

The present invention's conductive plates and interconnection traces are laid out so as to avoid the above-mentioned reliability problems. Design rules have been developed for many I.C. fabrication methods which are intended to avoid the kinds of failures discussed above when followed. These rules specify, for example, appropriate dimensions and minimum spacing requirements for interlayer interconnection traces. The preferred embodiment of the present invention is made with the two-metal, two-poly fabrication process discussed above. One set of design rules established for this process is found in J. P. Uyemura, *Physical Design of CMOS Integrated Circuits Using L-Edit®*, PWS Publishing Co. (1995), pp. 10–8 to 10–20, and the capacitor structure is preferably designed in accordance with the rules found therein. For example, the design rules require that a conductive layer can be connected to only one other conductive layer at any given spatial location. This prevents, for instance, the superimposition of a second metal plate via and a substrate via, which, if done, might provide such a steep step for the interconnecting metal as to make it unreliable. I.C. fabrication design rules often include dimensions stated in terms of "λ", which is a scalable unit used for length and width dimensions. When an I.C. layout is specified using λ units, it can be easily scaled up or down for other technologies or processes. The preferred embodiment is designed using the design rules (referenced above) established for the scalable n-well 2.0 μm CMOS analog process from MOSIS Orbit Semiconductor Corp. of Sunnyvale, Calif., for which λ is equal to 1.0 μm. In addition to the prohibition on the superimposition of vias, the design rules also establish a minimum spacing between vias of 2λ, and a requirement that each via be a 2λ-long×2λ-wide square.

A capacitor structure and interconnection scheme meeting all the cited design rules is shown in FIGS. 1A–1F. The structure is preferably fabricated with the two-metal, two-poly process, so that conductive plates 14 and 18 are poly ("first" and "second" poly plates, respectively), and conductive plates 22 and 26 are metal ("first" and "second" metal plates, respectively). A strip of metal 32 is preferably used to interconnect the second metal plate 26, second poly plate 18 and the substrate 10. The metal strip 32 is formed simultaneously with the first metal plate 22, both of which are defined within the process' first metal layer, but is electrically and physically isolated from metal plate 22. As is best seen in the cross-sectional view of FIG. 1B (taken along section line 1B—1B in FIG. 1A), the metal strip 32 meets the substrate 10 at a square contact area 34, gradually travels upward to meet the second metal plate 26 at a contact area 36, and meets the second poly plate 18 at a contact area 38. The substrate 10 is preferably more heavily doped in the area 39 at and around contact area 34, to provide a good electrical connection with metal strip 32.

Figure 1C:
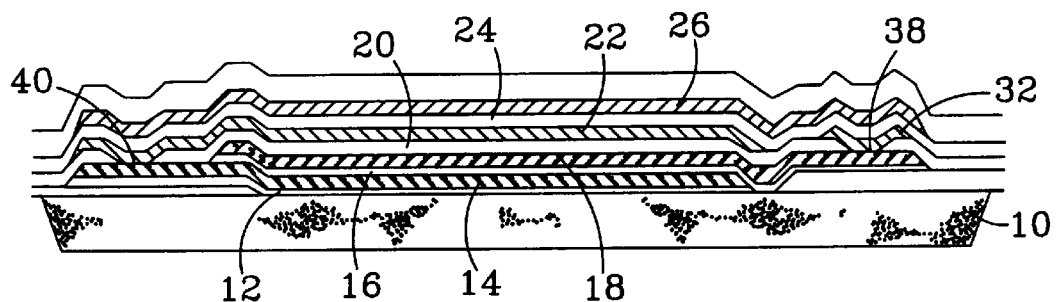
Figure 1D:
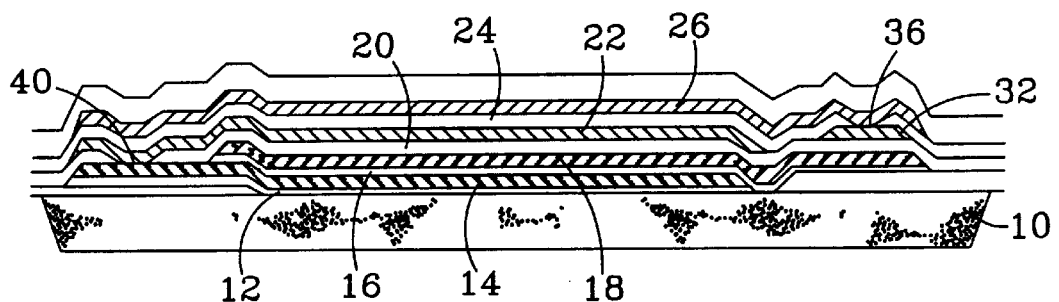
Figure 1E:
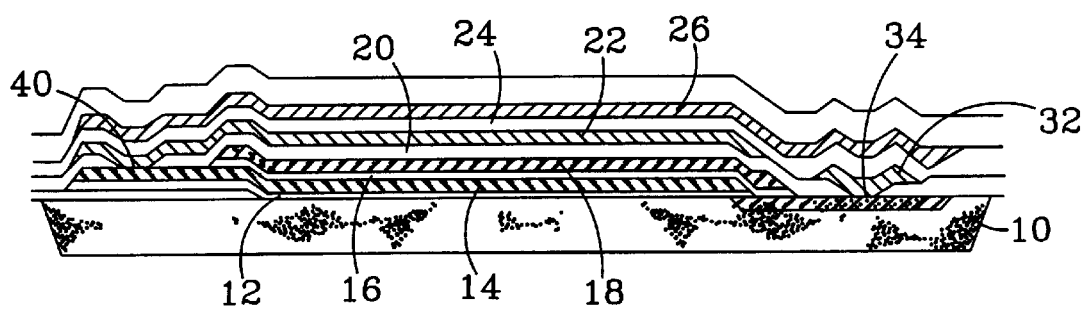

Cross-sectional views shown in FIGS. 1C, 1D and 1E, taken along section lines 1C—1C, 1D—1D and 1E—1E in FIG. 1A, clearly show the arrangement of the conductive layers and the interconnection scheme. Metal strip 32 is seen contacting the second poly plate 18 at contact area 38 (FIG. 1C), contacting the second metal plate 26 at contact area 36 (FIG. 1D), and contacting the substrate 10 at contact area 34 (FIG. 1E).

Because of the via superimposition and spacing rules, it is not practical to make the necessary interconnections using the conductive plates themselves—the resulting structure would cover a prohibitively large area. The metal strip 32, preferably about 4λ wide, makes the necessary interconnections between conductive plates while staying within the design rules cited above. More importantly, use of the isolated metal strip 32, in combination with a staggering of the edges of the conductive plates (discussed below), allow reliable interconnections to be made in a smaller area than would be required if the conductive plates themselves were used. An I.C.'s die area is invariably at a premium, and the invention's ability to squeeze more capacitance from a given amount of die area is a significant advantage.

The interconnection of the first poly plate 14 and the first metal plate 22 is accomplished without the need for a separate metal strip. Because only two conductive plates are being connected and less vertical distance is traversed with the interconnecting trace, the design rules are easily met using the conductive plates themselves. As is seen in the top plan view of FIG. 1A and the cross-sectional views of FIGS. 1C–1E, the first poly plate 14 and first metal plate 22 preferably meet at a number of redundant contact areas 40. Redundant contact areas are not essential to the invention, but may prolong the life of the device and are recommended if there is room for them. More contact areas are desirable in high-current applications, but integrated capacitors generally do not handle high current due to their very small size.

The conductive plates 14, 18, 22, and 26 are staggered to facilitate the interconnection scheme shown in FIGS. 1A–1F. That is, the boundaries of the respective plates are not contiguous. The arrangement of the conductive plates shown reduces the number of layers that an interconnection trace must traverse. For example, as shown in FIG. 1C, the second poly plate 18 is arranged to extend under a portion of metal strip 32 in order to make contact with it at contact area 38. However, as shown in FIG. 1E, the second poly plate 18 does not extend under the portion of strip which contacts the substrate, which, were plate 18 to be present, would necessitate the use of an additional via. Similarly, as shown in FIGS. 1C–1E, second poly plate 18 does not extend to the extreme left end of the structure (oriented as shown in FIG. 1A), so as not to interfere with the interconnections between the first poly plate 14 and first metal plate 22. The rightmost boundaries of the first poly plate 14 and first metal plate 22 (with respect to the orientation shown in FIG. 1A) preferably terminate to the left of the metal strip 32 (as shown in FIGS. 1C–1E), because no interconnections are made to them at the right end of the structure.

The preferred embodiment is designed to: 1) meet all of the cited design rules, and 2) provide the largest possible active area for each pair of adjacent conductive plates, and 3) occupy as little die area as possible. The only exception is with respect to the first metal plate 22/second metal plate 26 pair: the first metal plate 22 could have been made slightly larger than shown in FIG. 1A—the design rules would allow 2λ-high fingers of metal plate 22 to extend to the right edge of the structure along its top and bottom edges (avoiding the isolated metal strip 32)—but this small increase in active area is preferably sacrificed so that the resulting structure is more easily used as a repeatable structure (discussed below). The capacitor's overall dimensions are 42λ in length (l)×26λ in width (w), with an active area of about 26λ×26λ. For the λ=1.0 μm process cited above, the structure thus covers an area of about 42 μm×26 μm.

It is not essential that a capacitor designed per the present invention adhere to the design rules cited above, which are simply one set of guidelines that, when followed, are known to produce a reliable device. The designer is cautioned, however, to give careful consideration to the capacitor structure's interconnection scheme and conductive plate topology to insure that sound, reliable traces are produced.

The capacitance of a capacitor structure per the present invention is determined by calculating the active areas of respective pairs of adjacent conductive plates, using Eq. 1 to determine the capacitance of each pair, and summing the individual capacitance values. An equation has been derived to determine the approximate total active area width w needed to obtain a desired capacitance value (assuming an approximately square active area) for the preferred structure. The equation assumes that the first metal plate 22 stops 8λ from the right edge of the structure, the second poly plate 18 stops 7λ from the left edge of the of the structure, and a capacitance per unit area of 502.0 aF/μm². This capacitance per unit area value is found in J. P. Uyemura, *Physical Design of CMOS Integrated Circuits Using L-Edit®*, supra, the source of the design rules to which the preferred embodiment adhere, and is based on a particular oxide layer thickness (not stated). The cited rules do provide relative thicknesses, however, as follows: metal and poly layers are two units thick, the oxide layers directly below metal layers are two units thick, and the oxide layers directly below poly layers are one unit thick. Given these assumptions, the width w of an the active area (assumed to be approximately square) needed for a particular value of capacitance C is approximately given by:

$$w \approx 1.25 + \sqrt{(0.664)(C) - 0.438} \qquad \text{Eq. 2}$$

For example, to obtain a capacitor having a capacitance of about 1 pF, w is made equal to about 27 μm.

Equation 2 is subject to several sources of error. One error source is a series capacitance $C_{si}$ which exists between the bulk silicon substrate 10 and the interface between the substrate and the first oxide layer 12. This capacitance depends primarily on the doping level of the silicon—the higher the doping level, the lower the undesired series capacitance. It also depends on the temperature of the substrate and the applied voltage; these dependencies can result in functionality errors in critical applications if the resulting capacitance range is not properly compensated for in the circuit design employing the capacitor. $C_{si}$ is discussed in S.A. St. Onge, "Design of Precision Capacitors for Analog Applications," IEEE Transactions of Components, Hybrids, and Manufacturing Technology, vol. 15, no. 6 (December 1992), pp. 1064–1071. This typically very small capacitance is neglected in Eq. 2 above.

Another source of error is that of "edge" or "fringe" effects, which arise due to the convex curved fields that are inherently present at the outer edges of the conductive plates. These effects are discussed in G. W. A. Drummer, *Radio and Electronic Components: Volume 3—Fixed Capacitors*, Sir Isaac Pitman & Sons Ltd. (1964), pp. 12–13. These effects, which typically have a very small effect relative to the device's overall capacitance, are also neglected in the derivation of Eq. 2.

The conductive plates 14, 18, 22 and 26 preferably comprise the same materials that are deposited to form other circuit components. For example, for an I.C. fabricated with the two-metal, two-poly process discussed above, plates 14 and 18 are polysilicon and plates 22 and 26 are metal. This is the most efficient approach from a fabrication standpoint. Since the layers needed to form the capacitor are needed for other circuit components, the capacitors are formed without any additional processing steps.

However, the invention is not limited to capacitors formed from already necessary layers, nor to a two-metal, two-poly CMOS process. For example, bipolar transistor processing generally only requires the deposition of a single metal layer on a substrate. Capacitors per the present invention can be fabricated with bipolar components on the same I.C. die, but additional masking and deposition steps are needed to provide the additional conductive and oxide layers needed for the capacitor structure.

Other possible variations encompassed by the invention include capacitor structures with just three interdigitated conductive plates above the substrate, and structures having more than four interdigitated conductive plates. A structure with fewer that the preferred four layers results in an integrated capacitor with less capacitance per unit area than the preferred embodiment, but reduces the complexity of the interconnection scheme. A three-conductive-plate structure would also require fewer additional processing steps than would a four-plate devise when fabricated with a bipolar process, for example. Additional layers, on the other hand, provide more capacitance per unit area than does the preferred embodiment, but increases the complexity of the interconnection scheme. The additional surface area required to implement reliable interconnections in accordance with stated design rules may be prohibitively large.

Figure 2A:
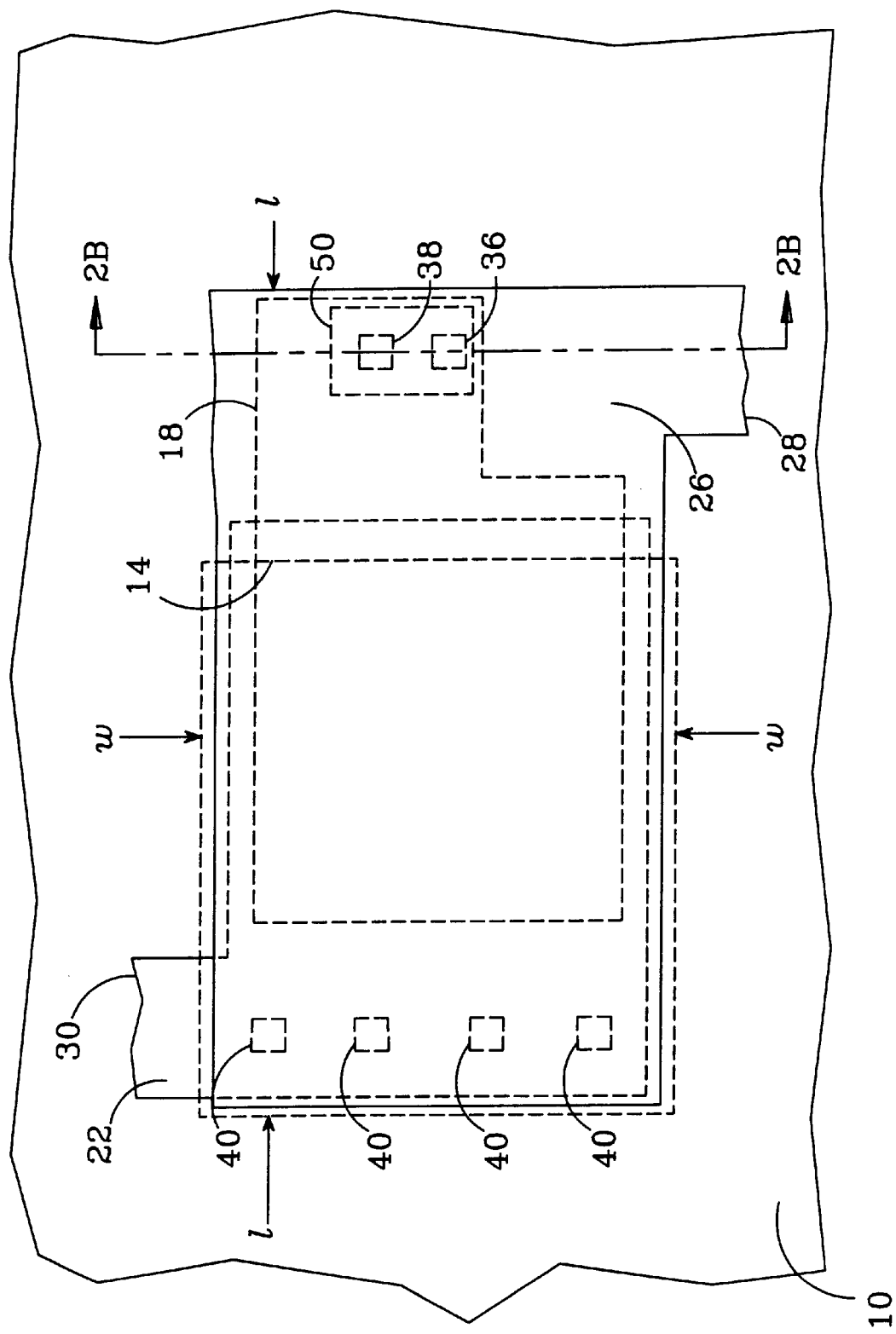
FIG. 2A is a top plan view of a modified version of the capacitor structure shown in FIG. 1A.
Figure 2B:
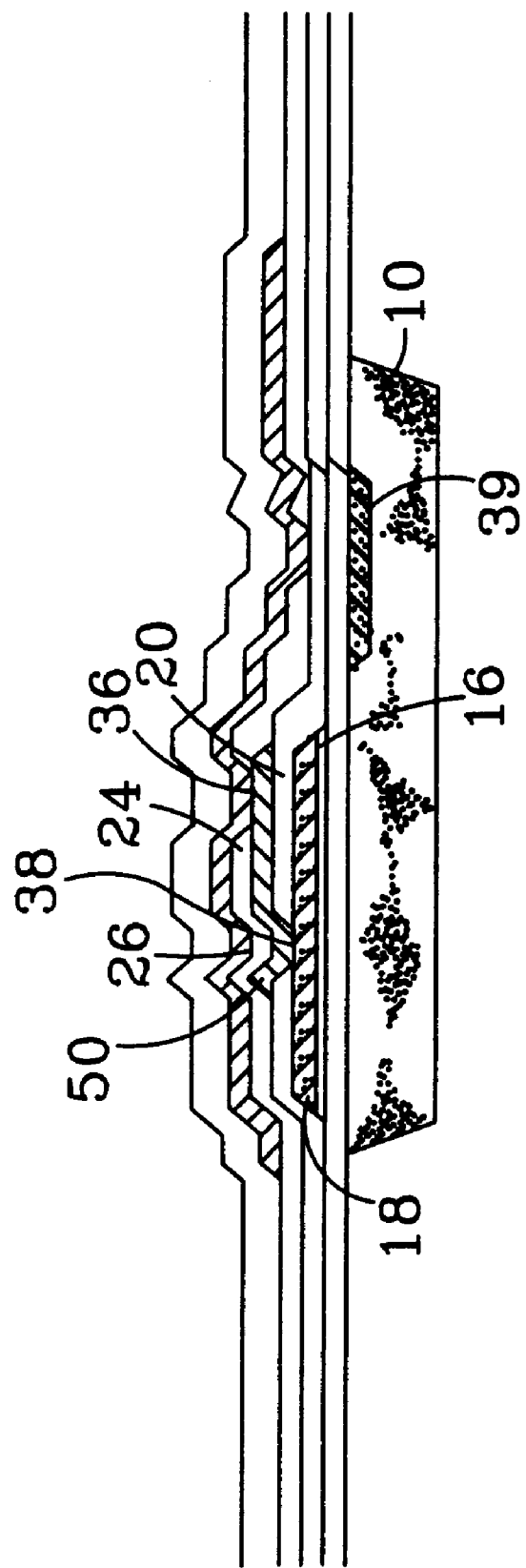
FIG. 2B is a cross-sectional view of the structure of FIG. 2A, taken along section line 2B—2B.

Several variations to the preferred embodiment have been developed and characterized. One such variation does not use the silicon substrate 10 as a conductive plate. Since the substrate is typically only moderately doped, it is less conductive than the poly and metal plates and thus tends to increase the capacitor's charging time. Thus, for speed-sensitive applications the substrate is omitted as a conductive plate, and the interdigitated structure includes only the two metal and two poly plates. This variant requires more surface area to produce a given capacitance than does the preferred embodiment, but is still considerably smaller than a conventional two-layer capacitor, and requires no process modifications. One implementation of this variant is shown in the top plan view of FIG. 2A, with a corresponding cross-sectional view shown in FIG. 2B. The structure is basically the same as that shown in FIGS. 1A–1E, except that there is no need for an interconnection to the substrate. A metal strip 50 interconnects the second metal plate 26 and second poly plate 18, but unlike metal strip 32 in FIGS. 1A–1E, metal strip 50 does not extend down to the substrate surface and thus no contact area 34 is needed. When the substrate 10 is not used as a conductive plate, the relationship between w and C is approximately given by:

$$w \approx 0.625 + \sqrt{(0.996)(C) - 0.391} \qquad \text{Eq. 3}$$

Another variation of the preferred structure allows the designer to use all five available conductive plates, but requires the addition of an extra masking and implantation step in the fabrication process. The bulk silicon substrate 10 is still used as the bottom conductive plate, but the portion of it that serves as the "bottom plate", i.e., that portion of the substrate directly opposite the first poly plate 14, is doped heavily enough to make it a good conductor. One masking and one implantation step are added prior to the deposition of the first poly layer, to increase the doping level of the bottom plate to at least $10^{17}$ atoms/cm$^3$ from its typical doping level of about $10^{15}$ atoms/cm$^3$. The resulting increase in the bottom plate's conductivity reduces the dependence of the substrate's inherent capacitance on applied voltage.

The poly plates 14, 18 can also adversely affect device performance due to their inferior conductivity with respect to the metal plates. An implementation of the present invention which addresses this problem requires that the conductivity of the poly plates be increased, which reduces the variation of the structure's capacitance as a function of applied voltage. To achieve a significant reduction in applied voltage dependence, the doping level of the poly plates is increased to at least $10^{17}$ atoms/cm$^3$ from its typical doping level of about $10^{16}$ atoms/cm$^3$. Attaining this doping level may require a change of source material for the poly layers, and/or the addition of extra masking and deposition steps. If a layer of polysilicon with a lower doping level is still needed (such as for I.C.s that use poly resistors), then both types of poly must be separately masked and deposited.

Another variation on the implementation of the interdigitated capacitor results in an increased capacitance per unit area. This is accomplished by reducing the thickness of the oxide layers directly below the metal plates to one unit thick. By halving the distance d between conductive plates, the capacitances provided by the first metal plate/second metal plate capacitor and the second poly plate/first metal plate capacitor are doubled (per Eq. 1). However, reducing the thickness of these oxide layers may adversely impact other components being simultaneously fabricated on the I.C. die which require a thicker oxide layer. One solution to this problem is to perform two oxide deposition steps, with the masking arranged so that the capacitor area receives only one of the depositions. The relationship between w and C for this variation is approximately given by:

$$w \approx 0.75 + \sqrt{(0.498)(C) - 0.938} \qquad \text{Eq. 4}$$

Higher capacitance values can be obtained by simply increasing the active area of the structure, while still abiding by the applicable design rules. A table is shown in FIG. 3 which tabulates the calculated capacitances for structures having an active area of 26λ×26λ (λ=1 μm for all variants), determined for the five-conductive-plate preferred embodiment (per Eq. 2), the four-conductive-plate variation (Eq. 3), and the thin-oxide variation (Eq. 4). Both the total active area and actual surface area are shown. In accordance with the cited design rules, actual surface area is approximately 16 μm longer than it is wide to accommodate the inter-layer contacts. For purposes of comparison, the table also gives the calculated capacitance values for conventional two-layer poly-poly capacitors having the same active area as a capacitor per the present invention. The poly-poly capacitors are assumed to be fabricated with the same one unit oxide layer thickness used in the preferred embodiment.

Figure 4:
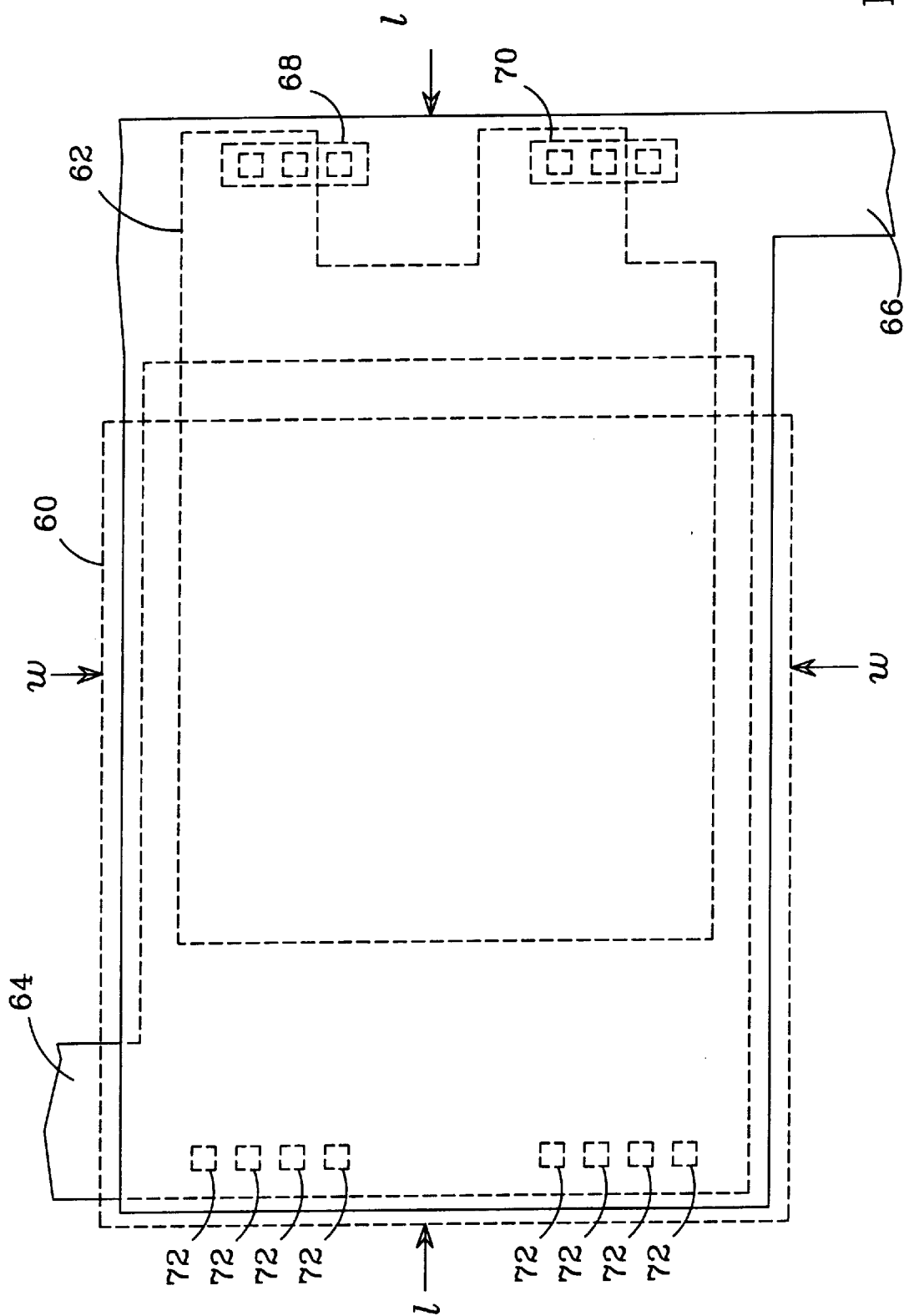
FIG. 4 is a top plan view of a larger version of the capacitor structure shown in FIG. 1A.

One method of obtaining larger capacitors is to simply replicate the preferred 26λ×26λ capacitor structure as needed, with the exception of the inter-layer interconnections, which remain at the right and left edges of the structure. This is illustrated in FIG. 4. The structure comprises a first poly plate 60, a second poly plate 62, a first metal plate 64 and a second metal plate 66, with their edges staggered in the same way as they are in FIG. 1A. However, both length and width dimensions have been doubled with respect to the basic structure, providing an active area of about 52 μm×52 μm and an actual surface area (1×w) of about 68 μm×52 μm. Though not essential to the proper functioning of the capacitor, the inter-layer contact pattern is preferably also repeated to improve the current capacity and reliability of the device. Thus, the capacitor has two metal strips 68 and 70 for interconnecting the top metal, top poly and substrate layers, and the pattern of contacts 72 on the left side of the structure repeats as well. The table in FIG. 3 includes calculated capacitances for structures formed from the following combinations of the basic structure: 2×2 (active area of 52 μm×52 μm), 3×3 (78 μm×78 μm), 4×4 (104 μm×104 μm), 20×20 (520 μm×520 ×μm) and 50×50 (1300 μm×1300 μm).

Integrated interdigitated capacitor structures as described herein are fabricated using conventional I.C. fabrication techniques. For example, a discussion of the two-metal, two-poly CMOS process can be found in P. E. Allen and D. R. Holberg, *CMOS Analog Circuit Design*, Holt, Rinehart and Winston (1987), pp. 22–87.

While particular embodiments of the invention have been shown and described, numerous variations and alternate embodiments will occur to those skilled in the art. Accordingly, it is intended that the invention be limited only in terms of the appended claims.

I claim:

1. An integrated circuit (I.C.) capacitor structure, comprising:

a substrate, at least three conductive plates stacked on said substrate, said plates arranged approximately parallel to said substrate and interdigitated such that each conductive plate at least partially overlaps at least one adjacent conductive plate, a plurality of dielectric layers electrically isolating respective conductive plates from their adjacent conductive plates and from said substrate, at least two interconnection traces, each of said traces arranged to interconnect at least two of said conductive plates, the edges of said conductive plates staggered to reduce the number of dielectric layers and conductive plates through which said interconnection traces must traverse, and a plurality of vias through which said interconnection traces traverse said dielectric layers and conductive plates, none of said vias superimposed over any other of said vias such that any one of said conductive plates contacts only one other of said conductive plates at any given spatial location.

2. An integrated circuit (I.C.) capacitor structure, comprising:

a substrate, four conductive plates stacked on said substrate, said plates arranged approximately parallel to said substrate and interdigitated such that each conductive plate at least partially overlaps at least one adjacent conductive plate, the two conductive plates nearest said substrate being polysilicon and the two conductive plates farthest from said substrate being metal, a plurality of dielectric layers electrically isolating respective conductive plates from their adjacent conductive plates and from said substrate, and two interconnection traces, each of said traces arranged to interconnect two of said conductive plates.

3. The capacitor structure of claim 2, wherein at least one of said polysilicon conductive plates is doped to a level of at least $10^{17}$ atoms/cm$^3$ to improve its conductivity.

4. The capacitor structure of claim 2, wherein said substrate comprises a fifth conductive plate and one of said interconnection traces is arranged to interconnect said substrate to at least one other of said conductive plates. conductive plates at any given spatial location.

5. The capacitor structure of claim 4, wherein said substrate is doped to a level of at least $10^{17}$ atoms/cm$^3$ to improve its conductivity.

6. The capacitor structure of claim 2, wherein at least one of said interconnection traces comprises a metal strip which contacts and thereby interconnects at least two of said conductive plates at respective contact areas and is physically isolated from said conductive plates except at said contact areas, said metal strip tending to reduce the area required to interconnect said conductive plates.

7. The capacitor structure of claim 2, wherein said conductive plates are photolithographically defined within respective conductive plates deposited on said substrate.

8. An integrated, interdigitated capacitor structure suitable for implementation with a two-metal, two-poly CMOS fabrication process, comprising:

a silicon substrate, a first oxide layer on said substrate, a first polysilicon plate on said first oxide layer, a second oxide layer on said first polysilicon plate, a second polysilicon plate on said second oxide layer, a third oxide layer on said second polysilicon plate, a first metal plate on said third oxide layer, a fourth oxide layer on said first metal plate, a second metal plate on said fourth oxide layer, and at least two interconnection traces, each of said traces arranged to interconnect at least two of said four polysilicon and metal plates, said polysilicon and metal plates arranged approximately parallel to said substrate and interdigitated such that each of said plates at least partially overlaps at least one other of said plates, said interconnected and interdigitated plates and said dielectric layers forming an integrated, interdigitated capacitor.

9. The capacitor structure of claim 8, wherein said polysilicon and metal plates are photolithographically defined within respective material layers deposited on said substrate, and one of said interconnection traces comprises a metal strip defined from said first metal layer but physically isolated from said first metal plate, said metal strip interconnecting said second polysilicon plate and said second metal plate and tending to reduce the area required to interconnect said conductive plates.

10. The capacitor structure of claim 9, wherein said metal strip further interconnects said substrate to said second poly plate and said second metal plate.

* * * * *